(12) United States Patent
Fujiwara (10) Patent No.: US 7,299,395 B2
(45) Date of Patent: Nov. 20, 2007

(54) TEST APPARATUS

(75) Inventor: Masaki Fujiwara, Tokyo (JP)

(73) Assignee: Advantest Corporation, Tokyo (JP)

( * ) Notice: Subject to any disclaimer, the term of this patent is extended or adjusted under 35 U.S.C. 154(b) by 58 days.

(21) Appl. No.: 11/311,065

(22) Filed: Dec. 19, 2005

(65) Prior Publication Data
US 2006/0095823 A1   May 4, 2006

Related U.S. Application Data

(63) Continuation of application No. PCT/JP2004/008228, filed on Jun. 11, 2004.

(30) Foreign Application Priority Data
Jun. 19, 2003   (JP) .............................. 2003-175436

(51) Int. Cl.
*G01R 31/28*   (2006.01)
(52) U.S. Cl. ......................... 714/738; 714/736
(58) Field of Classification Search ...................... None
See application file for complete search history.

(56) References Cited

U.S. PATENT DOCUMENTS 5,590,137 A * 12/1996 Yamashita ................... 714/744
6,513,138 B1 *  1/2003 Ohsawa ....................... 714/738

FOREIGN PATENT DOCUMENTS

| JP | 56-127253 | 10/1981 |
| JP | 02245675 A * | 10/1990 |
| JP | 0434299 A * | 12/1992 |
| JP | 9-293395 | 11/1997 |
| JP | 2001-133516 | 5/2001 |

OTHER PUBLICATIONS

NN8803116 Array Test Pattern Generation Algorithms for a Per Pin TesterVolume No. 30 Issue No. 10 p. No. 116-123 Publication-Date Mar. 1, 1988 (19880301)□□.*
International Search Report issued for PCT application No. PCT/JP2004/008228 mailed on Sep. 14, 2004, 1 page.

* cited by examiner

*Primary Examiner*—Cynthia Britt
(74) *Attorney, Agent, or Firm*—Osha Liang LLP (57) ABSTRACT

There is provided a test having a pattern generating section for generating a test pattern, an expected value generating section for generating an expected value, an inversion cycle generating section for generating an expected value pattern of an output signal in which bits in a cycle of the expected value pattern in the output data corresponding to the cycle in which the electronic device outputs the data by inverting the bits thereof, an H-level judging section for outputting H fail data per bit of the expected value pattern of the output signal, a L-level judging section for outputting L fail data per bit of the expected value pattern of the output signal, a fail memory and selecting sections for switching a logic value of the H fail data and a logic value of the L fail data when the inversion cycle generating section inverts the bits of the expected value pattern.

9 Claims, 6 Drawing Sheets

| MEMORY INTERNAL OUTPUT | 00000000 | 11111111 | 00000100 | 11011011 |
| INVERSION CYCLE SIGNAL | 0 | 1 | 0 | 1 |
| OUTPUT SIGNAL | 00000000 | 00000000 | 00000100 | 00100100 |

TEST APPARATUS

CROSS REFERENCE TO RELATED APPLICATION

This is a continuation application of PCT/JP2004/008228 filed on Jun. 11, 2004, which claims priority from a Japanese Patent Application No. JP 2003-175436 filed on Jun. 19, 2003, the contents of which are incorporated herein by reference.

BACKGROUND OF THE INVENTION

1. Field of the Invention

The present invention relates to a test apparatus for judging whether an electronic device has a defect or not. More specifically, the invention relates to a test apparatus for testing an electronic device that outputs an output signal in which bits of output data to be outputted are inverted or non-inverted per cycle.

2. Related Art

Conventionally, a test of an electronic device (DUT) such as DRAM and SRAM for storing electronic data for example is carried out by comparing an output signal outputted out of the DUT in which preset electronic data is stored with an expected value pattern identical with the electronic data.

The implementation of multi-bit electronic device is also remarkably advancing lately. Therefore, a number of output pins of the DUT in which logic values of the signal to be outputted are inverted in the same time increases, causing noise in the output signals as a result. In order to reduce such noise, there is an electronic device that outputs the signal by inverting output data per cycle of the output signal. That is, when there are many output pins in which output data is inverted from the preceding cycle, the number of output pins is reduced by inverting and outputting the output data of the respective output pins. In this case, the DUT also outputs an inversion cycle signal indicating that the output signal of that cycle is inverted.

However, when the DUT inverts and outputs the data of the output signal as described above, an expected value pattern to be compared with that output signal must be also inverted.

However, the conventional test apparatus is unable to recognize whether or not the DUT has inverted the output signal. Therefore, in order to carry out the test, it has been necessary for a user who conducts the test to judge whether or not the output signal of the DUT is inverted corresponding to electronic data given to the DUT in advance and to prepare an expected value pattern corresponding to the judgment result. Accordingly, it has been difficult to carry out the test of the DUT efficiently.

Still more, in storing H fail data for a H-level expected value and L fail data for a L-level expected value in a fail memory as a result of the test of the DUT, the test apparatus ends up storing the fail data to be originally stored as the H fail data and L fail data as the L fail data and H fail data, respectively, when the output signal of the DUT and the expected value pattern are inverted. Therefore, it has been difficult to analyze the DUT in detail.

SUMMARY OF THE INVENTION

Accordingly, it is an object of the invention to provide a pattern generator and a test apparatus that are capable of solving the above-mentioned problems. This object may be achieved through the combination of features described in independent claims of the invention. Dependent claims thereof specify preferable embodiments of the invention.

In order to solve the above-mentioned problems, according to a first aspect of the invention, there is provided a test apparatus for testing an electronic device that outputs an output signal in which bits of output data to be outputted are inverted or non-inverted per cycle, having a pattern generating section for generating a test pattern for testing the DUT, an expected value generating section for generating an expected value pattern of the output data to be outputted out of the DUT based on the test pattern.

The test apparatus may further have an inversion cycle generating section for generating an expected value pattern of the output signal in which bits in a cycle of the expected value pattern of the output data corresponding to a cycle in which the DUT inverts and outputs the output data are inverted, an H-level judging section for outputting H fail data indicating whether or not a bit of the output signal corresponding to a bit of the expected value pattern of the output signal indicating level H is level H per bit of the expected value pattern of the output signal, an L-level judging section for outputting L fail data indicating whether or not a bit of the output signal corresponding to a bit of the expected value pattern of the output signal indicating level L is level L per bit of the expected value pattern of the output signal, a fail memory for storing the H fail data as fail data when the output data indicates level H and stores the L fail data as fail data when the output data indicates level L and selecting sections for switching a logic value of the H fail data with a logic value of the L fail data when the inversion cycle generating section inverts the bits of the expected value pattern in storing in the fail memory.

The inversion cycle generating section may decide bit of which cycle of the expected value pattern are to be inverted based on the test pattern. Still more, the DUT may be a memory having an inversion area into which given data is written by inverting it and the test apparatus may further include an area inverting section for inverting bits to be written into the inversion area in advance among bits of the test pattern generated by the pattern generating section to feed to the DUT and the expected value generating section.

The selecting section may switch the logic value of the H fail data, corresponding to the bit inverted by the inversion cycle generating section in the expected value pattern and not inverted by the area inverting section in the test pattern or to the bit not inverted by the inversion cycle generating section in the expected value pattern and inverted by the area inverting section in the test pattern, with the logic value of the L fail data to store in the fail memory.

The area inverting section may generate an area inverting signal that indicates level H corresponding to the bit of the test pattern to be inverted, the pattern generating section may feed exclusive OR of the area inverting signal and the test pattern to the DUT and the expected value generating section, the inversion cycle generating section may output an inversion cycle signal indicating level H corresponding to the cycle of the test pattern in which the bit is to be inverted, the expected value generating section may feed exclusive OR of the test pattern fed to the DUT by the area inverting section and the inversion cycle signal to the H-level judging section and the L-level judging section as the expected value pattern, the test apparatus may further include a selection control section for outputting a control signal for controlling the selecting sections based on the exclusive OR of the area inverting signal and the inversion cycle signal and the selecting sections may switch the logic value of the H fail data with the logic value of the L fail data when the control signal indicates the level H in storing in the fail memory.

According to a second aspect of the invention, there is provided a test apparatus for testing an electronic device that outputs an output signal in which bits of output data to be outputted are inverted or non-inverted per cycle, having a pattern generating section for generating a test pattern for testing the DUT, an expected value generating section for generating an expected value pattern of the output data to be outputted out of the DUT based on the test pattern, a logic comparator for comparing the output signal outputted out of the DUT corresponding to the test pattern with the expected value pattern to judge whether or not the DUT has a defect, a comparator for calculating a number of bits in each cycle of the test pattern whose logic value has changed from the logic value of respective bits of the expected value pattern in the cycle preceding to that cycle to judge if the calculated number of bits is greater than a preset number of bits and an inversion cycle generating section for causing the expected value generating section to output a pattern in which the test pattern of the pertinent cycle is inverted as the expected value pattern for that cycle of the test pattern when the comparator judges that the number of bits is greater than the preset number of bits and causes the expected value generating section to output the test pattern of that cycle as the expected value pattern for the cycle of the test pattern when the comparator judges that the number of bits is smaller than the preset number of bits.

The electronic device may also output an inversion cycle signal indicating whether or not bits of the output signal are inverted per cycle of the output signal, the comparator may output an inversion cycle expected value indicating whether or not the calculated number of bits is greater than the preset number of bits and the logic comparator may judge whether or not the DUT is defect-free based also a result of comparison of the inversion cycle expected value with the inversion cycle signal.

The comparator may calculate the number of changing bits based also on whether or not the inversion cycle expected value to be outputted corresponding to the pertinent cycle has changed from the inversion cycle expected value of the cycle preceding to the pertinent cycle. The preset number of bits may be a value obtained by adding 1 to a half of a number of bits in one cycle of the test pattern and the comparator may output the inversion cycle expected value equal to the inversion cycle expected value corresponding to the preceding cycle of the pertinent cycle when the number of changing bits in the pertinent cycle is equal to the half of the number of bits in one cycle of the test pattern.

The test apparatus may further include a preceding cycle data holding section for holding the test pattern in the preceding cycle of the pertinent cycle, a preceding cycle inversion expected value holding section for holding the inversion cycle expected value corresponding to the preceding cycle and a preceding cycle expected value pattern generating section for generating the expected value pattern in the preceding cycle based on the test pattern in the preceding cycle held by the preceding cycle data holding section and the inversion cycle expected value corresponding to the preceding cycle held by the preceding cycle inversion expected value holding section, wherein the comparator may calculate the number of changing bits based on the expected value pattern of the preceding cycle and the test pattern of the pertinent cycle.

It is noted that the summary of the invention described above does not necessarily describe all necessary features of the invention. The invention may also be a sub-combination of the features described above.

Thus, the invention allows the test of the DUT that outputs the output signal by inverting or non-inverting per cycle to be carried out efficiently and accurately.

BRIEF DESCRIPTION OF DRAWINGS

FIGS. 2a and 2b show one exemplary operation of an electronic device, wherein

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
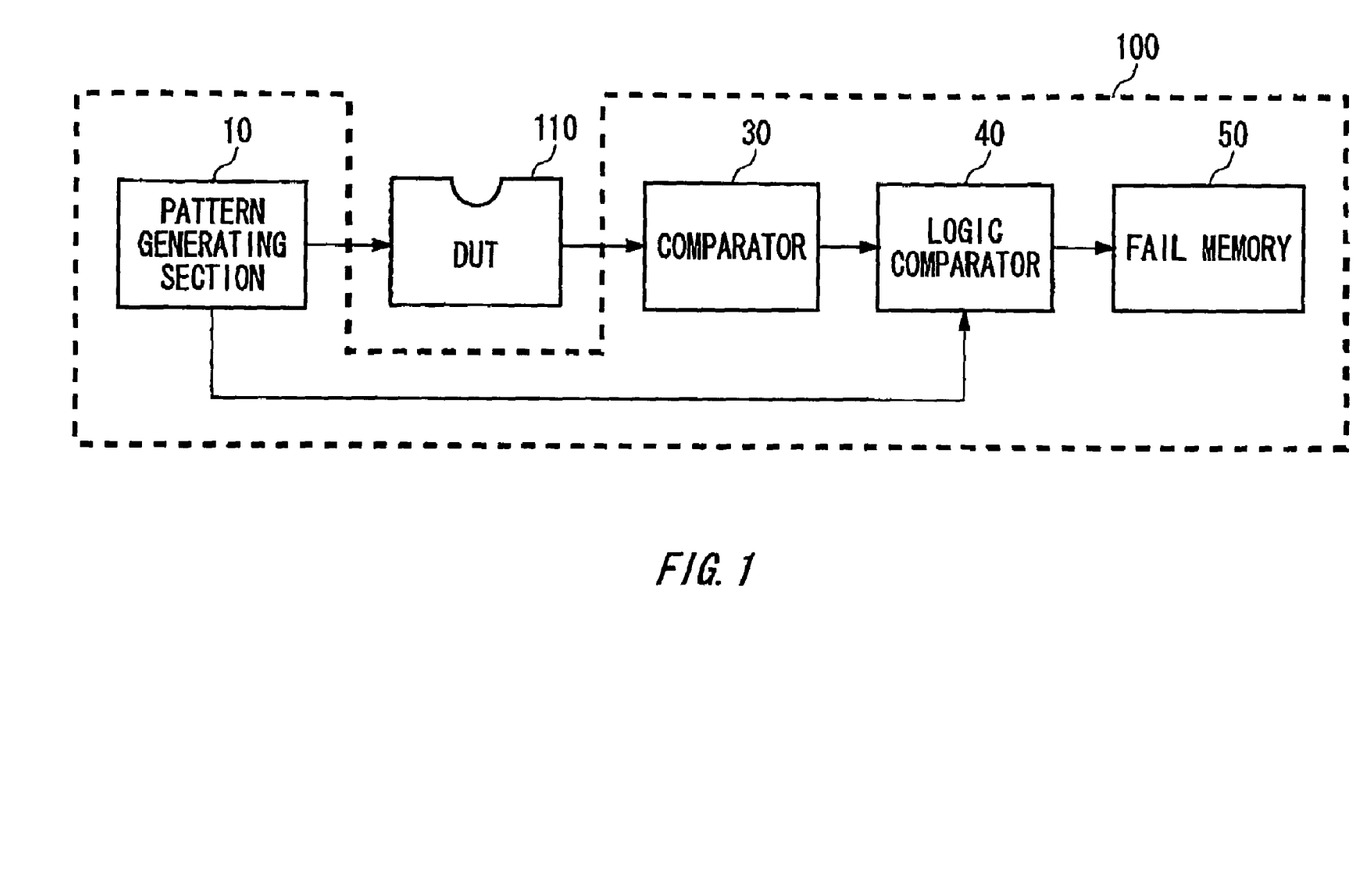
FIG. 1 is a diagram showing a schematic configuration of a test apparatus according one embodiment of the invention.

FIG. 1 is a diagram showing a schematic configuration of a test apparatus 100 according one embodiment of the invention. The test apparatus 100 performs a test of an electronic device 110. Here, the DUT 110 is a semiconductor memory such as a DRAM and SRAM.

The test apparatus 100 has a pattern generating section 10, a comparator 30, a logic comparator 40 and a fail memory 50. The pattern generating section 10 generates a test pattern to be fed to the DUT 110 to test the DUT 110. The pattern generating section 10 also feeds a signal for selecting a mode for writing electronic data to the DUT 110 and a mode for reading electronic data stored in the DUT 110 to the DUT 110. In writing electronic data to the DUT 110, the pattern generating section 10 generates a signal for designating an address in the DUT 110 and data to be written to the designated address and feeds them to the DUT 110. In reading electronic data out of the DUT 110, the pattern generating section 10 feeds a signal designating an address in the DUT 110 to the DUT 110.

The comparator 30 receives the data read out of the DUT 110 as an output signal and converts the output signal into a digital signal indicating logic H or L based on whether or not level of each data of the output signal is greater than level set in advance.

The logic comparator 40 compares the output signal with an expected value pattern generated by the pattern generating section 10 to judge whether or not the DUT 110 is defect-free. The pattern generating section 10 generates an expected value pattern having an identical pattern with the test pattern given to the DUT 110 for example.

The fail memory 50 stores the result of comparison of the output signal and the expected value pattern per address in the DUT 110. It becomes possible to judge an address in the DUT 110 where an error occurs by analyzing the comparison result stored in the fail memory 50.

Figure 2A:
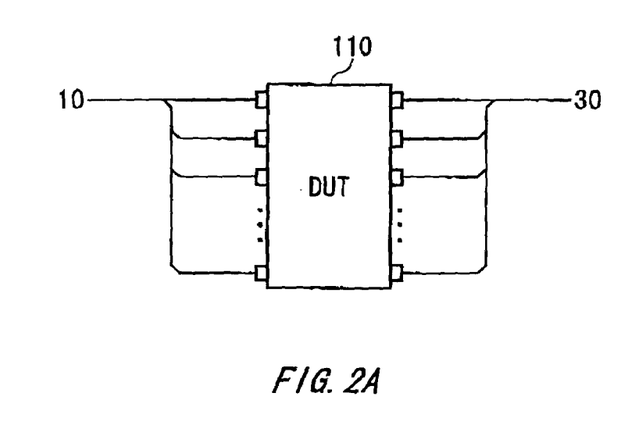
FIG. 2a shows the DUT having a plurality of input/output pins and FIG. 2b shows one exemplary output signal outputted out of the output pins of the DUT.
Figure 2B:
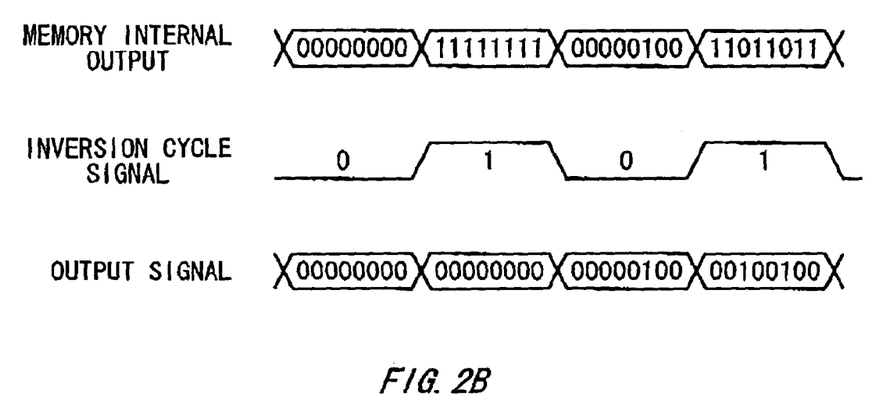

FIGS. 2a and 2b show one exemplary operation of the DUT 110. As shown in FIG. 2, the DUT 110 has a plurality of input/output pins. The plurality of output pins output data in synchronism per cycle of the output signal.

FIG. 2b shows one example of the output signal outputted out of the output pins of the DUT 110. In this example, the DUT 110 outputs 8 bit data per one cycle of the output signal.

When a preset test pattern is inputted through the input pin, the DUT 110 stores data corresponding to the test pattern in the designated address as shown in FIG. 2b. Then, the DUT 110 generates memory internal output (output data) corresponding to the test pattern within it. Although the respective output pins of the DUT 110 should output memory internal output (output data) at this time, the DUT 110 outputs an output signal in which the internal output data of the respective output pins is inverted when a number of output pins in which the internal output data is inverted is greater than a preset number of pins from the preceding cycle in the respective cycles of the internal output data.

For example, when the DUT 110 outputs the output data as it is corresponding to the first and second cycles of the memory internal output in FIG. 2b, the memory internal output is inverted in all of the output pins. In such a case, the DUT 110 outputs an output signal in which the memory internal output of the second cycle is inverted and an inversion cycle signal indicating whether or not bits of the memory internal output are inverted. The pattern generating section 10 of the present embodiment inverts data in the cycle of the expected value pattern corresponding to the cycle of the output signal in which the memory internal output is inverted and feeds it to the logic comparator 40.

The electronic device 110 may also have an inversion area into which given data is inverted and is written. That is, the DUT 110 may be a memory into which given data is inverted and written and which inverts and outputs the written data. For example, the DUT 110 may be a memory in which an address into which given data is inverted and written is set in advance in writing the data.

Figure 3:
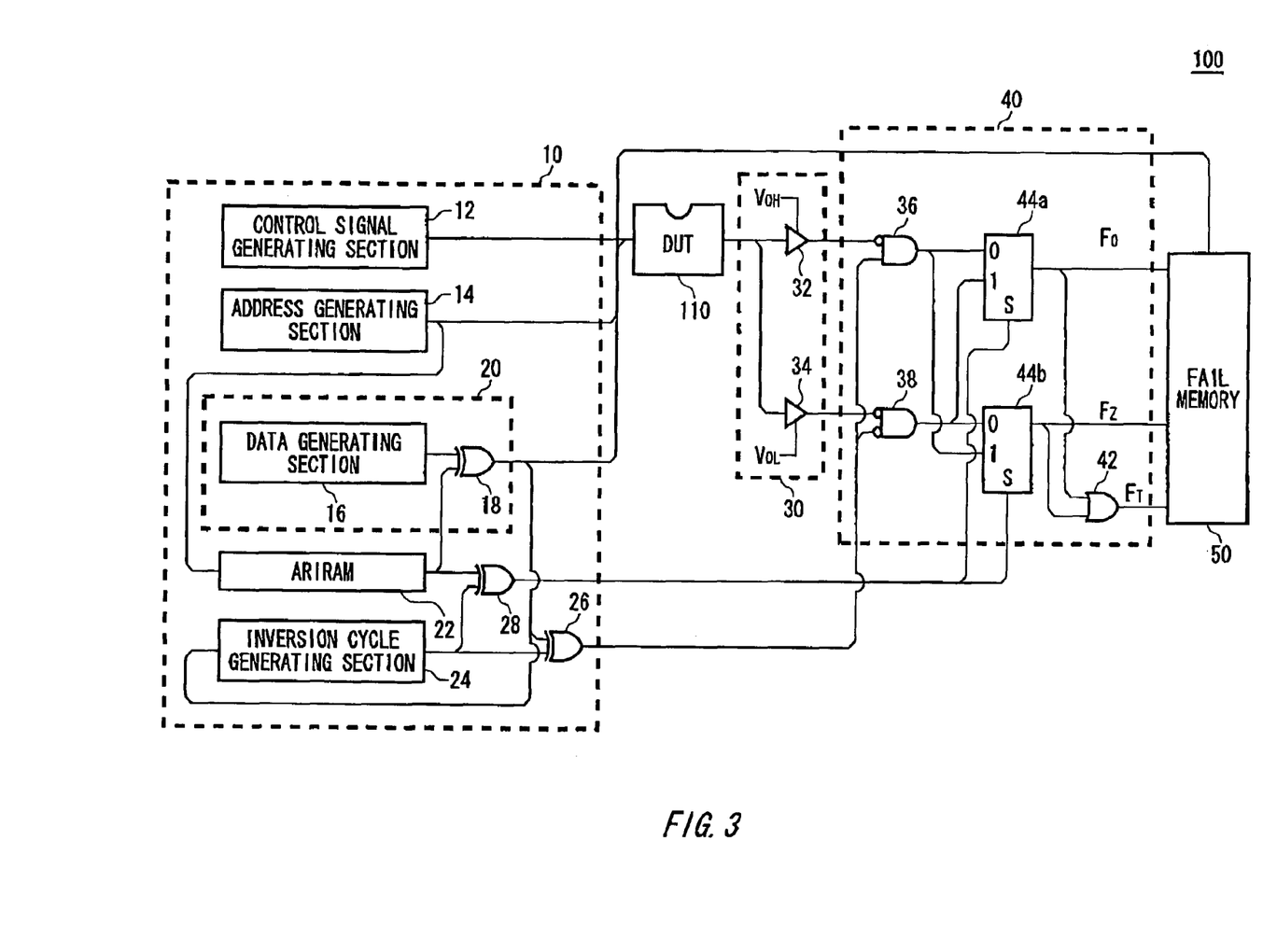
FIG. 3 is a diagram showing one exemplary configuration of the test apparatus in detail.

FIG. 3 is a diagram showing one exemplary configuration of the test apparatus 100 in detail. In FIG. 3, components having the same reference numerals with those in FIG. 1 have the same or similar functions and configurations with the components explained in connection with FIG. 1.

The pattern generating section 10 has a control signal generating section 12, an address generating section 14, a pattern generating section 20, an area inverting section (ARIRAM) 22, an inversion cycle generating section 24, an expected value generating section 26 and a selection control section 28. The control signal generating section 12 generates a signal for controlling the DUT 110 and feeds it to the DUT 110. For example, the control signal generating section 12 feeds a signal for setting the DUT 110 in the writing mode or the reading mode to the DUT 110.

The address generating section 14 generates the address in the DUT 110 to which data is to be written or the address in the DUT 110 from which the data is to be read and feeds it to the DUT 110.

The pattern generating section 20 generates the test pattern to be fed to the DUT 110. The pattern generating section 20 has a data generating section 16 and an exclusive OR circuit 18. The data generating section 16 generates test data indicating whether or not an internal cell of the DUT 110 is to be charged and the exclusive OR circuit 18 outputs exclusive OR of the test data generated by the data generating section 16 and an area inverting signal outputted by the area inverting section 22 as the test pattern.

The area inverting section 22 receives the address in the DUT 110 to which data is to be written from the address generating section 14 and based on that address, controls whether or not each bit of the test data generated by the data generating section 16 is to be inverted. In this example, the DUT 110 is a memory having an inversion area into which given data is inverted and written, and the area inverting section 22 feeds the test pattern in which bits to be written into the inversion area of the DUT 110 are inverted in advance, among bits of the test pattern generated by the pattern generating section 20, to the DUT 110 and the expected value generating section 26.

For example, the data generating section 16 generates 1111 . . . 1 as the test data in performing a test of charging all of the internal cells of the DUT 110. At this time, the area inverting section 22 controls whether or not the respective bits of the test data are to be inverted based on the address in the DUT 110 to which the respective bits of the test data are written. That is, when the DUT 110 inverts data and writes it to the address where the data is to be written, the area inverting section 22 causes the pattern generating section 20 to generate a test pattern in which bits of test data corresponding to that address are inverted. Such control allows the test of charging all of the internal cells of the DUT 110 to be carried out efficiently. In the present embodiment, the area inverting section 22 outputs an area inverting signal indicating logic H corresponding to timing of bit to be inverted in the test data.

The expected value generating section 26 generates the expected value pattern of the output data to be outputted out of the DUT 110 based on the test pattern generated by the pattern generating section 20. The expected value generating section 26 generates the expected value pattern in which the bits of the test pattern generated by the pattern generating section 20 are inverted or non-inverted based on whether or not the DUT 110 inverts data and outputs it per cycle of the output signal and whether or not the DUT 110 inverts the given test pattern and writes it as explained in connection with FIG. 2.

The inversion cycle generating section 24 feeds an inversion cycle expected value to the expected value generating section 26 so as to generate the expected value pattern in which bits in the cycle of the expected value pattern corresponding to the cycle in which the DUT 110 inverts and outputs the bits of the output data are inverted. The inversion cycle generating section 24 decides bits in which cycle are to be inverted in the expected value pattern based on the test pattern. The inversion cycle generating section 24 generates the inversion cycle expected value indicating logic H at timing corresponding to the cycle to be inverted in the expected value pattern based on the test pattern generated by the pattern generating section 20 as described later in FIG. 4.

Then, the expected value generating section 26 feeds the exclusive OR of the test pattern and the inversion cycle expected value to the logic comparator 40 as the expected value pattern. Such operation allows the expected value generating section 26 to generate the correct expected value pattern efficiently. The selection control section 28 outputs the exclusive OR of the area inverting signal and the inversion cycle signal as a control signal for controlling selecting sections 44a and 44b described later.

The comparator 30 receives the output signal outputted out of the DUT 110 and converts the output signal into a digital signal. The comparator 30 has an H-level comparator 32 and an L-level comparator 34. The H-level comparator 32 compares a preset H-level voltage value (VOH) with a voltage value of the output signal. It then outputs 1 when the voltage value of the output signal is greater than VOH and outputs 0 when the voltage value of the output signal is smaller than VOH. The L-level comparator 34 compares a preset L-level voltage value (VOL) with the voltage value of the output signal. It then outputs 1 when the voltage value of the output signal is smaller than VOL and outputs 0 when the voltage value of the output signal is greater than VOL.

The logic comparator 40 compares the output signal converted into the digital signal with the expected value pattern and outputs fail data based on the comparison result. The logic comparator 40 has an H-level judging section 36, an L-level judging section 38, the selecting sections 44a and 44b and an OR circuit 42.

The H-level judging section 36 outputs H fail data indicating whether or not a bit of the output signal corresponding to a bit of the expected value pattern of the output signal indicating H level is H level per bit of the expected value pattern of the output signal. The H-level judging section 36 may be an AND circuit for example and outputs AND of the inversion signal of the output signal which has been converted into the digital signal by the H-level comparator 32 and the expected value pattern.

The L-level judging section 38 outputs L fail data indicating whether or not a bit of the output signal corresponding to a bit of the expected value pattern of the output signal indicating L level is L level per bit of the expected value pattern of the output signal. The L-level judging section 38 may be an AND circuit for example and outputs AND of the output signal converted into the digital signal by the L-level comparator 34 and the expected value pattern.

The selecting sections 44a and 44b receive the H fail data and L fail data, select and output either the H fail data or L fail data based on the control signal outputted out of the selection control section 28. In the present embodiment, when the control signal indicates logic L, the selecting section 44a outputs H fail data and the selecting section 44b outputs L fail data. When the control signal indicates logic H, the selecting section 44a outputs L fail data and the selecting section 44b outputs H fail data.

The fail memory 50 stores the fail data outputted out of the selecting section 44a as H fail data when the output data indicates H level and stores the fail data outputted out of the selecting section 44b as L fail data when the output data indicates L level.

That is, the selecting sections 44a and 44b store them in the fail memory 50 by switching the logic value of the H fail data, corresponding to the bit inverted by the inversion cycle generating section 24 in the expected value pattern and not inverted by the area inverting section 22 in the test pattern (and in the expected value pattern) or to the bit not inverted by the inversion cycle generating section 24 in the expected value pattern and inverted by the area inverting section 22 in the test pattern, with the logic value of the L fail data. That is, the selecting sections 44a and 44b store them by switching the logic value of the H fail data with the logic value of the L fail data when the expected value pattern is inverted only by the inversion cycle generating section 24 or the area inverting section 22 and without switching the logic value of the H fail data and the logic value of the L fail data when the both of the inversion cycle generating section 24 and the area inverting section 22 have inverted the expected value pattern and when neither of them have inverted the expected value pattern.

Such control allows the H fail data and L fail data to be correctly stored in the fail memory 50. When the output signal and the expected value pattern are inverted and outputted for example, the H-level judging section 36 judges L level data, i.e., the discharge stage, as internal data of the DUT 110. In such a case, although the fail memory 50 should store the judgment result of the H-level judging section 36 as L fail data, there has been a case in the conventional test apparatus that the fail memory stores fail data to be stored as L fail data as H fail data or stores fail data to be stored as H fail data as L fail data because the conventional test apparatus does not take such control. Therefore, it has been difficult to analyze the DUT 110 accurately.

However, the test apparatus 100 of the present embodiment allows the DUT 110 to be accurately analyzed because it can store the H fail data and L fail data correctly in the fail memory 50. Still more, the OR circuit 42 outputs OR of the fail data outputted out of the selecting section 44a and the fail data outputted out of the selecting section 44b. That is, when a fail occurs at least in either one of the L fail data and H fail data, the OR circuit 42 stores fail data FT indicating the fail in the fail memory 50. The use of the fail data FT allows the simple analysis of the DUT 110 to be carried out efficiently.

Figure 4:
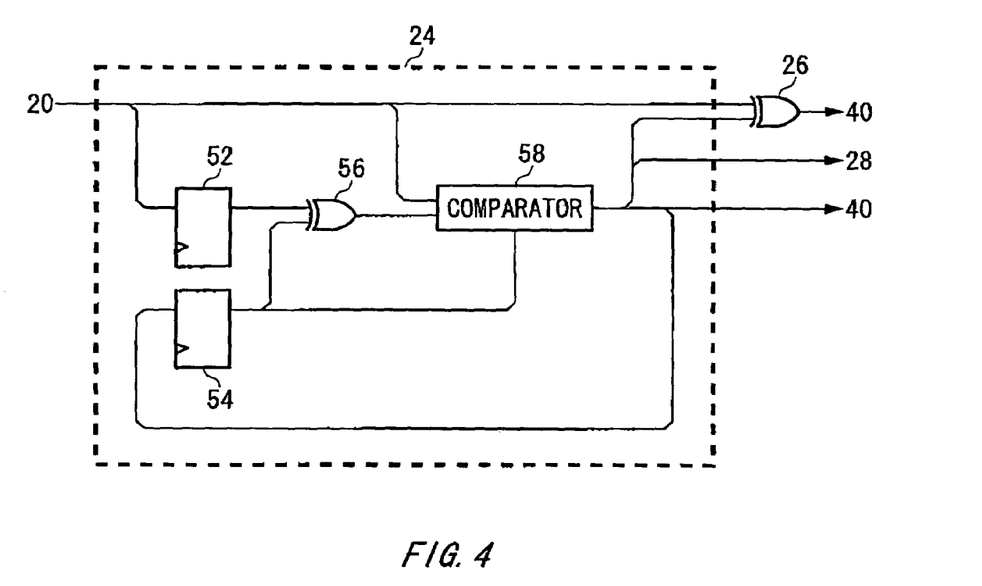
FIG. 4 is a diagram showing one exemplary configuration of an inversion cycle generating section.

FIG. 4 is a diagram showing one exemplary configuration of the inversion cycle generating section 24. The inversion cycle generating section 24 has a preceding cycle data holding section 52, a preceding cycle inversion expected value holding section 54, a preceding cycle expected value pattern generating section 56 and a comparator 58. The operation of the inversion cycle generating section 24 will be explained by using FIG. 5.

Figure 5:
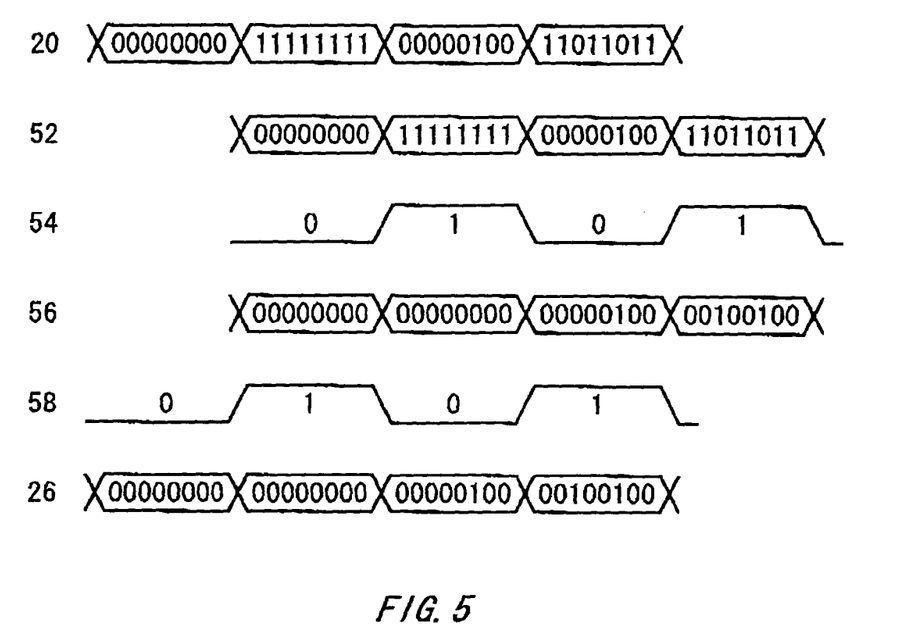
FIG. 5 is a chart showing one exemplary operation of the inversion cycle generating section.

FIG. 5 is a chart showing one exemplary operation of the inversion cycle generating section 24. As the test pattern is fed to the inversion cycle generating section 24 from the pattern generating section 20, the preceding cycle data holding section 52 outputs a signal in which the test pattern is delayed by one cycle as shown in FIG. 5 as a test pattern of the preceding cycle.

The preceding cycle inversion expected value holding section 54 receives an inversion cycle expected value generated by the inversion cycle generating section 24 and outputs a signal in which the inversion cycle expected value is delayed by one cycle as an inversion cycle expected value of the preceding cycle.

The preceding cycle expected value pattern generating section 56 outputs exclusive OR of the test pattern of the preceding cycle generated by the preceding cycle data holding section 52 and the inversion cycle expected value of the preceding cycle as an expected value pattern of the preceding cycle.

The comparator 58 calculates a number of bits, in each cycle of the test pattern received from the pattern generating section 20, whose logic value has changed from the logic value of each bit of the expected value pattern in the preceding cycle of that cycle to judge if the calculated number of bits is greater than a preset number of bits. The comparator 58 also feeds the inversion cycle expected value indicating logic H to the expected value generating section 26 and the selection control section 28 when it judges that the number of changing bits exceeds the preset number of bits.

In the present embodiment, the comparator 58 judges if the calculated number of bits exceeds the preset number of bits under the same condition with the condition of judging if the DUT 110 inverts each output data per cycle and outputs it.

For instance, when the DUT 110 outputs 8 bits data in one cycle and data of 5 bits or more is inverted and when it outputs data by inverting all data in that cycle, the comparator 58 judges if the number of changing bits is 5 or more. Since the judging condition in the DUT 110 is set in advance by the specification of the DUT 110, the condition may be readily given to the comparator 58.

Then, when the comparator 58 outputs the inversion cycle expected value indicating the logic H, i.e., when it judges that the number of changing bits exceeds the preset number of bits, the inversion cycle generating section 24 causes the expected value generating section 26 to output a pattern in which the test pattern of that cycle is inverted as an expected value pattern for that cycle of the test pattern. When the comparator 58 outputs the inversion cycle expected value indicating the logic L, i.e., when it judges that the number of changing bits is smaller than the preset number of bits, the inversion cycle generating section 24 causes the expected value generating section 26 to output the test pattern of that cycle as an expected value pattern for that cycle of the test pattern. Such operation allows the correct expected value pattern to be generated readily even if the DUT 110 outputs output data by inverting or non-inverting per cycle.

Still more, in judging whether or not the DUT 110 outputs by inverting the output data based on that if the inversion cycle signal inverts or not, the comparator 58 calculates the number of changing bits based further on that if the inversion cycle expected value to be outputted corresponding to that cycle has changed from the inversion cycle expected value of the preceding cycle of that cycle. That is, the comparator 58 selects if the expected value pattern of that cycle is to be inverted based on that if the inversion cycle expected value to be outputted corresponding to that cycle has changed from the inversion cycle expected value of the preceding cycle of that cycle.

For instance, when the preset number of bits in the comparator 58 is a value obtained by adding 1 to a half of the number of bits in one cycle of the test pattern and the number of changing bits in that cycle is equal to a half of the number of bits in one cycle of the test pattern, the comparator 58 outputs an inversion cycle expected value equal to the inversion cycle expected value corresponding to the preceding cycle of that cycle.

When the DUT 110 outputs an inversion cycle signal of a plurality of bits, preferably the inversion cycle generating section 24 outputs an inversion cycle expected value of a plurality of bits corresponding to the inversion cycle signal of the plurality of bits. For instance, when the DUT 110 is a device that outputs an inversion cycle signal of 1 bit per 8 bits of the output signal, whose output signal is 72 bits and which outputs the inversion cycle signal of 9 bits, preferably the inversion cycle generating section 24 outputs an inversion cycle expected value of 9 bits. In this case, when the number of changing bits in that cycle is equal to the half of number of bits in one cycle of the test pattern, the comparator 58 outputs the inversion cycle expected value of plural bits equal to the inversion cycle expected value of plural bits corresponding to the preceding cycle of that cycle.

The test apparatus 100 of the present embodiment allows the correct expected value pattern to be efficiently generated even when the DOT 110 outputs the output signal by inverting or non-inverting per cycle.

The logic comparator 40 may further compare the inversion cycle signal outputted out of the DUT 110 with the inversion cycle expected value and may store the comparison result in the fail memory 50. In this case, preferably the comparator 58 feeds the inversion cycle expected value to the logic comparator 40.

Figure 6:
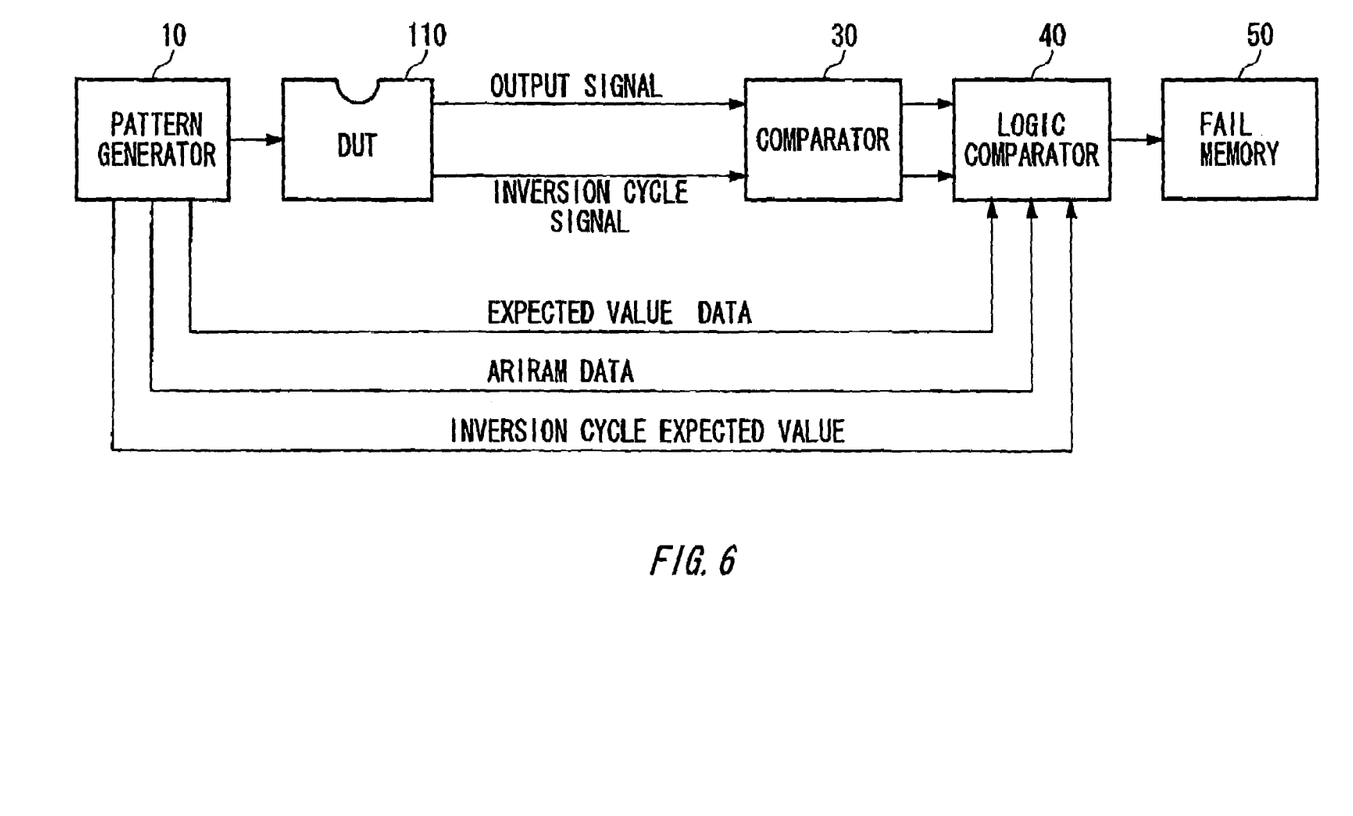
FIG. 6 is a diagram showing another exemplary configuration of the test apparatus.

FIG. 6 is a diagram showing another exemplary configuration of the test apparatus 100. The test apparatus 100 of the present embodiment judges whether or not the DUT 110 is defect-free based further on the inversion cycle signal outputted out of the DUT 110. In FIG. 6, components denoted by the same reference numerals with those in FIG. 1 have the same or similar function and configuration with those components explained in connection with FIG. 1 through FIG. 5.

In this example, the comparator 58 of the pattern generating section 10 feeds the inversion cycle expected value to the logic comparator 40 and the logic comparator 40 compares the inversion cycle signal outputted out of the DUT 110 with the inversion cycle expected value and stores the comparison result in the fail memory 50 as described above. The test apparatus 100 of the present embodiment allows the test of the DUT 110 to be carried out more accurately.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

INDUSTRIAL APPLICABILITY

As it is apparent from the above description, the invention allows the test of the DUT that outputs the output signal by inverting or non-inverting per cycle to be carried out efficiently and accurately.

What is claimed is:

1. A test apparatus for testing an electronic device that outputs an output signal:
    a pattern generating section for generating a test pattern for testing said electronic device;
    an expected value generating section for generating an expected value pattern of output data to be compared with said output data to be outputted out of said electronic device based on said test pattern;
    an inversion cycle generating section for generating an expected value pattern of said output signal, during a cycle in which said electronic device inverts and outputs bits of said output data, by inverting the bits of the expected value pattern of said output data corresponding to the cycle wherein the output signal and the expected value comprise level H and/or level L bits,
    an H-level judging section for outputting H fail data indicating whether or not a bit of said output signal corresponding to a bit of the expected value pattern indicating level H is level H per bit of the expected value pattern;
    an L-level judging section for outputting L fail data indicating whether or not a bit of said output signal corresponding to a bit of the expected value pattern indicating level L is level L per bit of the expected value pattern;
    a fail memory for storing said H fail data as fail data when said output data indicates level H and stores said L fail data as fail data when said output data indicates level L; and
    selecting sections for switching a logic value of said H fail data with a logic value of said L fail data when said inversion cycle generating section inverts the bits of said expected value pattern in storing in said fail memory.

2. The test apparatus as set forth in claim 1, wherein said inversion cycle generating section decides bits of which cycle in said expected value pattern are to be inverted based on said test pattern.

3. The test apparatus as set forth in claim 1, wherein said electronic device is a memory having an inversion area into which given data is written by inverting it; and said test apparatus further comprises an area inverting section for inverting bits to be written into said inversion area in advance among bits of said test pattern generated by said pattern generating section to feed to said electronic device and said expected value generating section.

4. The test apparatus as set forth in claim 3, wherein said selecting section switches the logic value of said H fail data, corresponding to the bit inverted by said inversion cycle generating section in said expected value pattern and not inverted by said area inverting section in said test pattern or to the bit not inverted by said inversion cycle generating section in said expected value pattern and inverted by said area inverting section in said test pattern, with the logic value of said L fail data to store in said fail memory.

5. The test apparatus as set forth in claim 4, wherein said area inverting section generates an area inverting signal that indicates level H corresponding to the bit of said test pattern to be inverted; said pattern generating section feeds exclusive OR of said area inverting signal and said test pattern to said electronic device and said expected value generating section; said inversion cycle generating section outputs an inversion cycle signal indicating level H corresponding to the cycle of said test pattern in which the bit is to be inverted; said expected value generating section feeds exclusive OR of said test pattern fed to said electronic device by said area inverting section and said inversion cycle signal to said H-level judging section and said L-level judging section as said expected value pattern; said test apparatus further comprises a selection control section for outputting a control signal for controlling said selecting sections based on the exclusive OR of said area inverting signal and said inversion cycle signal; and said selecting sections switch the logic value of said H fail data with the logic value of said L fail data when said control signal indicates the level H in storing in said fail memory.

6. A test apparatus for testing an electronic device that outputs an output signal, comprising:
  a pattern generating section for generating a test pattern for testing said electronic device;
  an expected value generating section for generating an expected value pattern of output data to be compared with said output data to be outputted out of said electronic device based on said test pattern;
  a logic comparator for comparing the output signal outputted out of said electronic device corresponding to said test pattern with said expected value pattern to judge whether or not said electronic device is defect-free;
  a comparator for calculating a number of bits in a cycle of said test pattern whose logic value has changed from the logic value of respective bits of said expected value pattern in the previous cycle preceding to the cycle to judge if said calculated number of bits is greater than a preset number of bits; and
  an inversion cycle generating section for causing said expected value generating section to output a pattern in which the test pattern of the cycle is inverted as said expected value pattern for the cycle of said test pattern when said comparator judges that said number of bits is greater than the preset number of bits and for causing said expected value generating section to output the test pattern of the cycle as said expected value pattern for the cycle of said test pattern when said comparator judges that said number of bits is smaller than said preset number of bits,
  wherein said electronic device also outputs an inversion cycle signal indicating whether or not bits of said output signal are inverted per cycle of said output signal,
  wherein said comparator outputs an inversion cycle expected value indicating whether or not said calculated number of bits is greater than the preset number of bits, and
  wherein said logic comparator judges whether or not said electronic device is defect-free based also on a result of comparison of said inversion cycle expected value with said inversion cycle signal.

7. The test apparatus as set forth in claim 6, wherein said comparator calculates said number of changing bits based also on whether or not said inversion cycle expected value to be outputted corresponding to the cycle has changed from said inversion cycle expected value of the previous cycle preceding to said cycle.

8. The test apparatus as set forth in claim 6, wherein said preset number of bits is a value obtained by adding 1 to a half of a number of bits in one cycle of said test pattern; and said comparator outputs said inversion cycle expected value equal to said inversion cycle expected value corresponding to the previous cycle preceding to the cycle when said number of changing bits in the cycle is equal to the half of the number of bits in one cycle of said test pattern.

9. A test apparatus for testing an electronic device that outputs an output signal, comprising:
  a pattern generating section for generating a test pattern for testing said electronic device;
  an expected value generating section for generating an expected value pattern of output data to be compared with said output data to be outputted out of said electronic device based on said test pattern;
  a logic comparator for comparing the output signal outputted out of said electronic device corresponding to said test pattern with said expected value pattern to judge whether or not said electronic device is defect-free;
  a comparator for calculating a number of bits in a cycle of said test pattern whose logic value has changed from the logic value of respective bits of said expected value pattern in the previous cycle preceding to the cycle to judge if said calculated number of bits is greater than a preset number of bits; and
  an inversion cycle generating section for causing said expected value generating section to output a pattern in which the test pattern of that cycle is inverted as said expected value pattern for that cycle of said test pattern when said comparator judges that said number of bits is greater than the preset number of bits and for causing said expected value generating section to output the test pattern of that cycle as said expected value pattern for the cycle of said test pattern when said comparator judges that said number of bits is smaller than said preset number of bits,
  a preceding cycle data holding section for holding said test pattern in the previous cycle of the cycle; a preceding cycle inversion expected value holding section for holding said inversion cycle expected value corresponding to the previous cycle; and a preceding cycle expected value pattern generating section for generating said expected value pattern in the previous cycle based on said test pattern in the previous cycle held by said previous cycle data holding section and said inversion cycle expected value corresponding to the previous cycle held by said previous cycle inversion expected value holding section;

wherein said comparator calculates said number of changing bits based on said expected value pattern of the previous cycle and the test pattern of the cycle.

* * * * *

UNITED STATES PATENT AND TRADEMARK OFFICE
CERTIFICATE OF CORRECTION

PATENT NO. : 7,299,395 B2  
APPLICATION NO. : 11/311065  
DATED : November 20, 2007  
INVENTOR(S) : Masaki Fujiwara Page 1 of 1

It is certified that error appears in the above-identified patent and that said Letters Patent is hereby corrected as shown below:

On the Title Page:

On the Title Page, section (56) References Cited, Foreign Patent Documents, line 3, "JP 0434299 12/1992" should be --JP 0434<u>9</u>299 12/1992--.

Signed and Sealed this

First Day of July, 2008

JON W. DUDAS  
*Director of the United States Patent and Trademark Office*